United States Patent
Lajoie et al.

(10) Patent No.: US 12,080,643 B2
(45) Date of Patent: Sep. 3, 2024

(54) INTEGRATED CIRCUIT STRUCTURES HAVING DIFFERENTIATED INTERCONNECT LINES IN A SAME DIELECTRIC LAYER

(71) Applicant: Intel Corporation, Santa Clara, CA (US)

(72) Inventors: Travis W. Lajoie, Forest Grove, OR (US); Abhishek A. Sharma, Hillsboro, OR (US); Juan G. Alzate Vinasco, Tigard, OR (US); Chieh-Jen Ku, Hillsboro, OR (US); Shem O. Ogadhoh, Beaverton, OR (US); Allen B. Gardiner, Portland, OR (US); Blake C. Lin, Portland, OR (US); Yih Wang, Portland, OR (US); Pei-Hua Wang, Beaverton, OR (US); Jack T. Kavalieros, Portland, OR (US); Bernhard Sell, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1174 days.

(21) Appl. No.: 16/583,691

(22) Filed: Sep. 26, 2019

(65) Prior Publication Data
US 2021/0098373 A1   Apr. 1, 2021

(51) Int. Cl.
  *H01L 23/522*  (2006.01)
  *H01L 21/768*  (2006.01)
  *H01L 23/528*  (2006.01)

(52) U.S. Cl.
  CPC .... *H01L 23/5283* (2013.01); *H01L 21/76816* (2013.01); *H01L 21/76829* (2013.01); *H01L 23/5223* (2013.01); *H01L 23/5226* (2013.01)

(58) Field of Classification Search
  CPC ............. H01L 23/5283; H01L 23/5222; H01L 23/5226; H01L 23/5329; H01L 23/53295;
  (Continued)

(56) References Cited

U.S. PATENT DOCUMENTS 5,126,006 A * 6/1992 Cronin ...................... G03F 1/50
                                                               430/296
5,651,855 A * 7/1997 Dennison .......... H01L 21/76808
                                                               438/634
(Continued)

FOREIGN PATENT DOCUMENTS

CN       104934368 A  *  9/2015  ....... H01L 21/76802
CN       107579037 A  *  1/2018  ........... H01L 21/768
(Continued)

OTHER PUBLICATIONS

Zhimao Ming et al., A review of the technology and process on integrated circuits failure analysis applied in communications products, 2016, Journal of Physics: Conference Series, vol. 679, 012040-1-012040-6 (Year: 2016).*

*Primary Examiner* — Samuel Park
(74) *Attorney, Agent, or Firm* — Schwabe, Williamson & Wyatt, P.C.

(57) ABSTRACT

Integrated circuit structures having differentiated interconnect lines in a same dielectric layer, and methods of fabricating integrated circuit structures having differentiated interconnect lines in a same dielectric layer, are described. In an example, an integrated circuit structure includes an inter-layer dielectric (ILD) layer above a substrate. A plurality of conductive interconnect lines is in the ILD layer. The plurality of conductive interconnect lines includes a first interconnect line having a first height, and a second interconnect line immediately laterally adjacent to but spaced apart from the first interconnect line, the second interconnect line having a second height less than the first height.

13 Claims, 11 Drawing Sheets

(58) Field of Classification Search
CPC ............. H01L 23/528; H01L 21/02126; H01L 21/0337; H01L 21/31111; H01L 21/31144; H01L 21/76802; H01L 21/76816; H01L 21/76829; H01L 21/76834; H01L 21/76877; H01L 21/76879; H01L 21/76897; H01L 23/5223; H01L 29/785; H10B 12/0335
USPC .......... 257/84, 140, 265, 334, 737, E21.585, 257/E21.705, E23.145, E27.001; 438/6, 438/128, 109, 280, 593, 600, 622, 625, 438/634, 635, 669
See application file for complete search history.

(56) References Cited

U.S. PATENT DOCUMENTS

| | | | | |
|---|---|---|---|---|
| 5,756,395 | A * | 5/1998 | Rostoker | H01L 23/53223 438/622 |
| 6,887,769 | B2 * | 5/2005 | Kellar | H01L 24/13 257/E21.705 |
| 9,263,382 | B2 * | 2/2016 | Yang | H01L 21/76898 |
| 9,343,369 | B2 * | 5/2016 | Du | H01L 23/528 |
| 9,406,512 | B2 * | 8/2016 | Bristol | H01L 21/0337 |
| 2012/0256324 | A1 * | 10/2012 | Liao | H01L 23/53295 257/E21.585 |
| 2012/0314468 | A1 * | 12/2012 | Siau | G11C 13/0026 977/755 |
| 2013/0256908 | A1 * | 10/2013 | Mclaurin | H01L 25/0657 438/109 |
| 2014/0061924 | A1 * | 3/2014 | Chen | H01L 23/53238 257/E23.145 |
| 2015/0130058 | A1 * | 5/2015 | Chen | H01L 24/14 257/737 |
| 2016/0372607 | A1 * | 12/2016 | Le | H01L 29/42364 |
| 2021/0028299 | A1 * | 1/2021 | Liu | H01L 29/42376 |
| 2021/0366988 | A1 * | 11/2021 | Chen | H10B 63/80 |

FOREIGN PATENT DOCUMENTS

| | | | |
|---|---|---|---|
| EP | 2399288 A2 * | 12/2011 | ......... H01L 21/4853 |
| EP | 2812919 A1 * | 12/2014 | ........... H01L 23/147 |
| WO | WO-2017222525 A1 * | 12/2017 | |

* cited by examiner

INTEGRATED CIRCUIT STRUCTURES HAVING DIFFERENTIATED INTERCONNECT LINES IN A SAME DIELECTRIC LAYER

TECHNICAL FIELD

Embodiments of the disclosure are in the field of semiconductor structures and processing and, in particular, integrated circuit structures having differentiated interconnect lines in a same dielectric layer, and methods of fabricating integrated circuit structures having differentiated interconnect lines in a same dielectric layer.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into the 10 nanometer node or sub-10 nanometer node range. Consequently, fabrication of the functional components needed for future technology nodes may require the introduction of new methodologies or the integration of new technologies in current fabrication processes or in place of current fabrication processes.

DESCRIPTION OF THE EMBODIMENTS

Figure 1A:
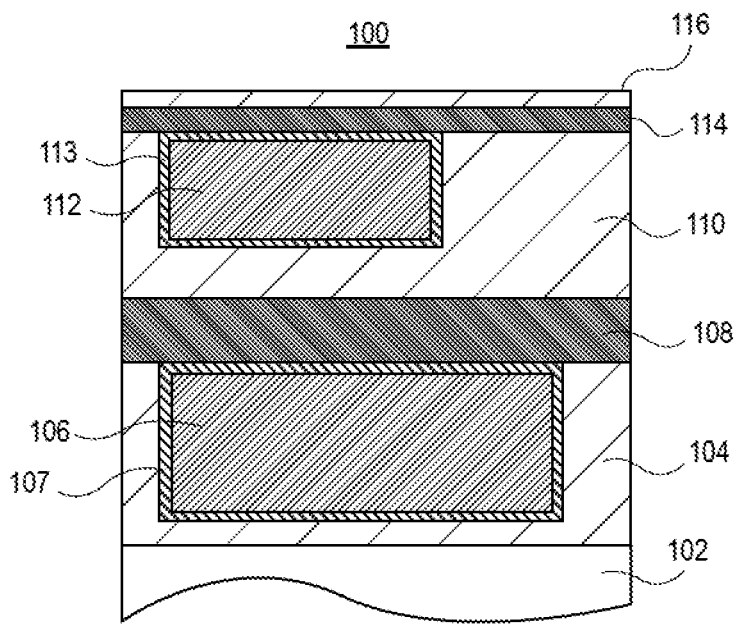
FIG. 1A illustrates a cross-sectional view of differentiated interconnect lines in different dielectric layers.

Integrated circuit structures having differentiated interconnect lines in a same dielectric layer, and methods of fabricating integrated circuit structures having differentiated interconnect lines in a same dielectric layer, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions or context for terms found in this disclosure (including the appended claims):

"Comprising." This term is open-ended. As used in the appended claims, this term does not foreclose additional structure or operations.

"Configured To." Various units or components may be described or claimed as "configured to" perform a task or tasks. In such contexts, "configured to" is used to connote structure by indicating that the units or components include structure that performs those task or tasks during operation. As such, the unit or component can be said to be configured to perform the task even when the specified unit or component is not currently operational (e.g., is not on or active). Reciting that a unit or circuit or component is "configured to" perform one or more tasks is expressly intended not to invoke 35 U.S.C. § 112, sixth paragraph, for that unit or component.

"First," "Second," etc. As used herein, these terms are used as labels for nouns that they precede, and do not imply any type of ordering (e.g., spatial, temporal, logical, etc.).

"Coupled"—The following description refers to elements or nodes or features being "coupled" together. As used herein, unless expressly stated otherwise, "coupled" means that one element or node or feature is directly or indirectly joined to (or directly or indirectly communicates with) another element or node or feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation or location or both of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, or effect which might otherwise occur. Accordingly, when a component, element, or feature is referred to as inhibiting a result or state, it need not completely prevent or eliminate the result or state.

Embodiments described herein may be directed to back end of line (BEOL) semiconductor processing and structures. BEOL is the second portion of IC fabrication where the individual devices (e.g., transistors, capacitors, resistors, etc.) get interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

Pitch division processing and patterning schemes may be implemented to enable embodiments described herein or may be included as part of embodiments described herein. Pitch division patterning typically refers to pitch halving, pitch quartering etc. Pitch division schemes may be applicable to FEOL processing, BEOL processing, or both FEOL (device) and BEOL (metallization) processing. In accordance with one or more embodiments described herein, optical lithography is first implemented to print unidirectional lines (e.g., either strictly unidirectional or predominantly unidirectional) in a pre-defined pitch. Pitch division processing is then implemented as a technique to increase line density.

In an embodiment, the term "grating structure" for fins, gate lines, metal lines, ILD lines or hardmask lines is used herein to refer to a tight pitch grating structure. In one such embodiment, the tight pitch is not achievable directly through a selected lithography. For example, a pattern based on a selected lithography may first be formed, but the pitch may be halved by the use of spacer mask patterning. Even further, the original pitch may be quartered by a second round of spacer mask patterning. Accordingly, the grating-like patterns described herein may have metal lines, ILD lines or hardmask lines spaced at a substantially consistent pitch and having a substantially consistent width. For example, in some embodiments the pitch variation would be within ten percent and the width variation would be within ten percent, and in some embodiments, the pitch variation would be within five percent and the width variation would be within five percent. The pattern may be fabricated by a pitch halving or pitch quartering, or other pitch division, approach. In an embodiment, the grating is not necessarily single pitch.

One or more embodiments described herein are directed to integrated circuit structures having differentiated dimensions at a same level, e.g., adjacent one another in a same dielectric layer. To provide context, previously attempted processes may have limitations in either their flexibility of design. Implementation of embodiments described herein may allow for design flexibility for metal routing, small signal tracks, large power lines and continuously variable line/space patterns to support peripheral circuitry that needs larger line/space patterns.

In accordance with an embodiment of the present disclosure, a pattern includes elements with variable widths and/or heights of metal lines. Advantages of implementing one or more embodiments described herein may include enabling flexible line/space patterns for peripheral circuitry. Embodiments described herein may be compatible with any one or more type of lithography such as 248, 193, 193i, EUV, e-beam, etc.

In a first aspect, modular interconnect layers embedded in a backend (BE) dielectric layer are described.

To provide context, for memory and logic applications, metal lines with different capacitance need to be used to route signals. Current approaches include, in order to have interconnects with different capacitance, drawing the lines at different levels. When lines are drawn at different levels, more routing and layers are required to draw connections in a same direction. For applications requiring different RC and electromigration (EM) specifications, this can represent an increase in the number of total layers and die area.

One or more embodiments described herein enable the fabrication of metal lines with different intrinsic capacitance to be patterned at a same layer. Embodiments may be implemented to reduce the number of patterning operations and area required to pattern the circuits.

Embodiments can include interconnects embedded in the same dielectric layer with different depth, size and pitch. The layers can be patterned with metal lines drawn at a same top height, a same bottom height, or are not aligned. There can be sealing/protection layers drawn above, below, or around either line type. Vias can be drawn from either line. There can be as many different patterned line depths as necessary. Embodiments can include the fabrication of lines with different RC in a same dielectric layer. Such lines can route signals through circuits of different capacitance in the same direction at the same time to save space and via patterning operations. Embodiments can include lines patterned in a single pass or with dual pass patterning including pitch division. Lines can be fabricated with different depths or with tops at different levels.

To provide a comparative example, FIG. 1A illustrates a cross-sectional view of differentiated interconnect lines in different dielectric layers.

Referring to FIG. 1A, an integrated circuit structure 100 includes a first dielectric layer 104 above a substrate 102. A first metal line 106/107 is in the first dielectric layer 104. The first metal line 106/107 can include a conductive fill 106 at least partially surrounded by a barrier layer 107. A first etch stop layer 108 is over the first metal line 106/107 and the first dielectric layer 104. A second dielectric layer 110 is above the etch stop layer 108. A second metal line 112/113 is in the second dielectric layer 110. The second metal line 112/113 can include a conductive fill 112 at least partially surrounded by a barrier layer 113. A second etch stop layer 114 is over the second metal line 112/113 and the second dielectric layer 110. A third dielectric layer 116 can be above the second etch stop layer 114.

Figure 1B:
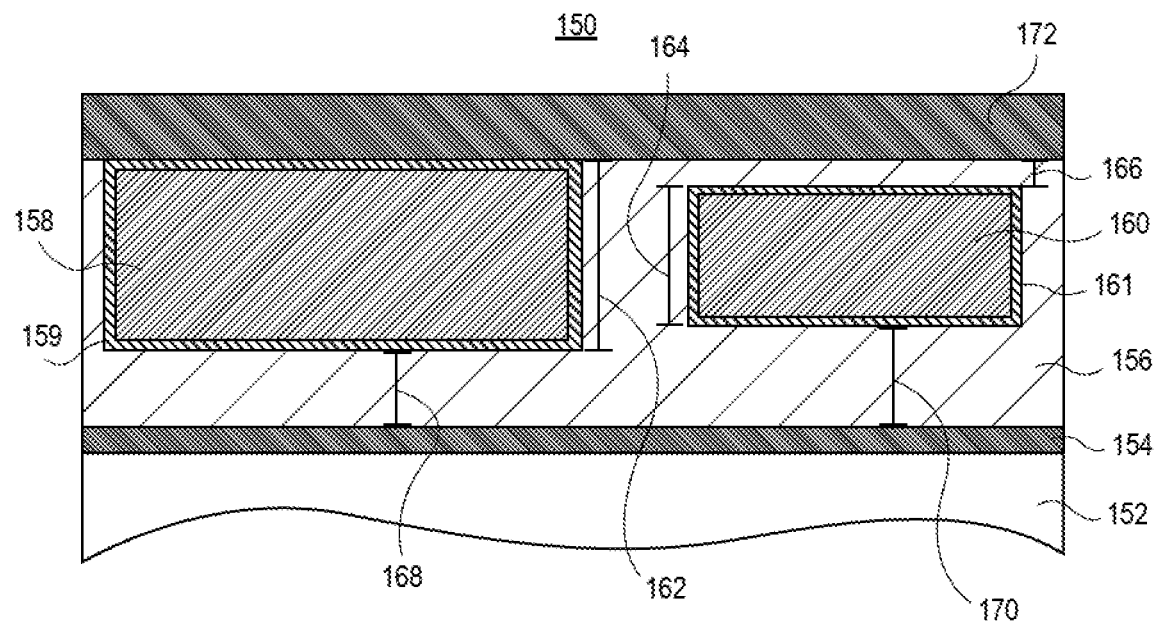
FIG. 1B illustrates a cross-sectional view of differentiated interconnect lines in a same dielectric layer, in accordance with an embodiment of the present disclosure.

In contrast to FIG. 1A, FIG. 1B illustrates a cross-sectional view of differentiated interconnect lines in a same dielectric layer, in accordance with an embodiment of the present disclosure.

Referring to FIG. 1B, an integrated circuit structure 150 includes a dielectric layer 156 above a first etch stop layer 154 above a substrate 152. A first metal line 158/159 is in the dielectric layer 156. The first metal line 158/159 can include a conductive fill 158 at least partially surrounded by a barrier layer 159. A second metal line 160/161 is the dielectric layer 156. The second metal line 160/161 can include a conductive fill 160 at least partially surrounded by a barrier layer 161. A second etch stop layer 172 is over the dielectric layer 156.

In an embodiment, the first metal line 158/159 has a thickness 162 greater than the thickness 164 of the second metal line 160/161, as is depicted. In an embodiment, the first metal line 158/159 has a top surface a distance (in this case, zero) from the second etch stop layer 172 less than a distance 166 of the top surface of the second metal line 160/161 from the second etch stop layer 172, as is depicted.

In an embodiment, the first metal line 158/159 has a bottom surface a distance 168 from the first etch stop layer 154 less than a distance 170 of the bottom surface of the second metal line 160/161 from the first etch stop layer 154, as is depicted.

With reference again to FIG. 1B, in accordance with an embodiment of the present disclosure, an integrated circuit structure 150 includes an inter-layer dielectric (ILD) layer 156 above a substrate 152. A plurality of conductive interconnect lines 158(159)/160(161) is in the ILD layer 156. The plurality of conductive interconnect lines 158(159)/160(161) includes a first interconnect line 158(159) having a first height, and a second interconnect line 160(161) immediately laterally adjacent to but spaced apart from the first interconnect line 158(159). The second interconnect line 160(161) has a second height less than the first height.

In one embodiment, the second interconnect line 160(161) has a top surface below a top surface of the first interconnect line 158(159), as is depicted. In another embodiment, not depicted, the second interconnect line 160(161) has a top surface co-planar with a top surface of the first interconnect line 158(159). In one embodiment, the top surface of the first interconnect line 158(159) is co-planar with a top surface of the ILD layer 156, as is depicted. In one embodiment, the second interconnect line 160(161) has a bottom surface above a bottom surface of the first interconnect line 158(159), as is depicted. In one embodiment, the second interconnect line 160(161) has a width less than a width of the first interconnect line 158(159), as is depicted.

In one embodiment, the integrated circuit structure 150 further includes an etch stop layer 172 on the ILD layer 156, as is depicted. In one embodiment, the first interconnect line 158(159) is defined by a first lithographic process, and the second interconnect line 160(161) is defined by a second lithographic process. In one embodiment, the first interconnect line 158(159) has a same composition as the second interconnect line 160(161). In one embodiment, the first interconnect line 158(159) has a different composition than the second interconnect line 160(161).

Figure 1C:
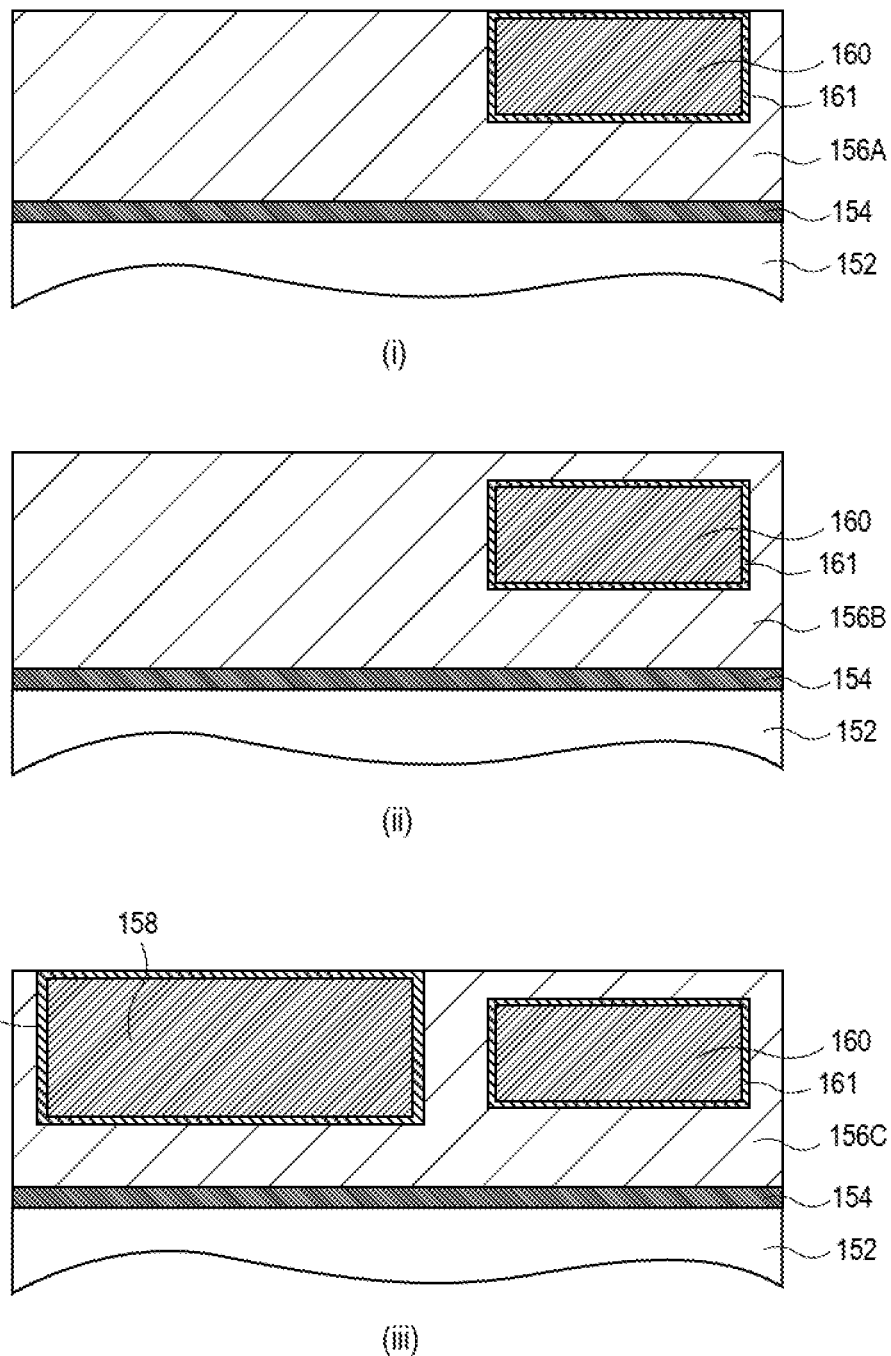
FIG. 1C illustrates cross-sectional views representing various operations in a method of fabricating differentiated interconnect lines in a same dielectric layer, in accordance with an embodiment of the present disclosure.

As an exemplary processing scheme, FIG. 1C illustrates cross-sectional views representing various operations in a method of fabricating differentiated interconnect lines in a same dielectric layer, in accordance with an embodiment of the present disclosure.

Referring to part (i) of FIG. 1C, a starting structure includes a dielectric layer 156A above an etch stop layer 154 above a substrate 152. A metal line 160/161 is formed in the dielectric layer 156A. The metal line 160/161 can include a conductive fill 160 at least partially surrounded by a barrier layer 161. In one embodiment, the metal line 160/161 is formed using a first lithographic process.

Referring to part (ii) of FIG. 1C, additional dielectric material is formed on the structure of part (i) to provide thicker dielectric layer 156B.

Referring to part (iii) of FIG. 1C, dielectric layer 156B is patterned to form dielectric layer 156C. A metal line 158/159 is formed in the dielectric layer 156C. The metal line 158/159 can include a conductive fill 158 at least partially surrounded by a barrier layer 159. In one embodiment, the metal line 158/159 is formed using a second lithographic process, different than the first lithographic process. It is to be appreciated that since they are fabricated in different operations, metal line 158/159 can have a same or different composition as metal line 160/161.

In a second aspect, lateral connections in interconnect layers are described.

To provide context, for memory and logic applications, metal lines may be patterned and etched in multiple operations. Present approaches require such lines to be attached from the bottom or top by via layers. Thus, more routing is required at upper layers and extra process operations are needed to connect lines.

Embodiments described herein may enable lines to be connected laterally, saving both space and processing operations. Embodiments can be implemented to connect two different line types patterned at different times. In particular, lateral connections between two or more adjacent metal lines can be patterned at different times. The lines can be patterned and filled at different times or patterned in multiple operations and connected prior to fill. Embodiments may be implemented to save via patterning masks and reduce the number of required dielectric layers for facile and versatile connection between circuits with different RC constants while saving space. In an embodiment, there can be two or more different height lines being connected in this way.

Figure 2A:
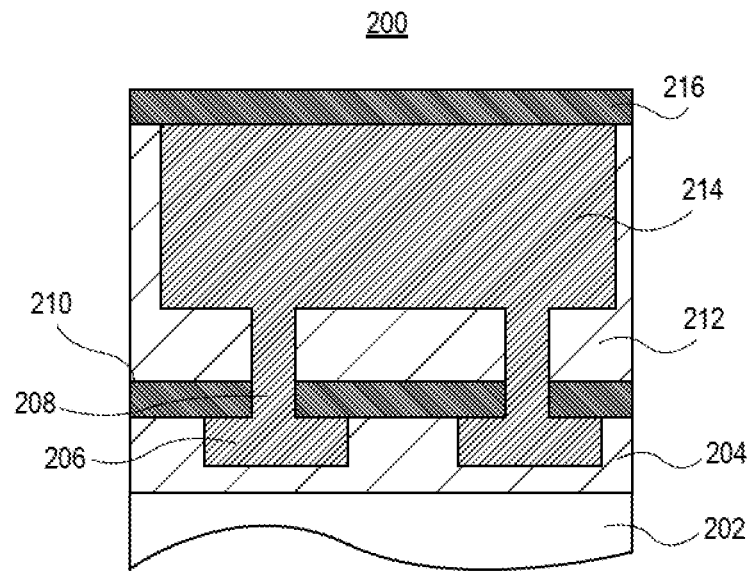
FIG. 2A illustrates a cross-sectional view of coupled differentiated interconnect lines in different dielectric layers.

To provide a comparative example, FIG. 2A illustrates a cross-sectional view of coupled differentiated interconnect lines in different dielectric layers.

Referring to FIG. 2A, an integrated circuit structure 200 includes a first dielectric layer 204 above a substrate 202. A pair of metal lines 206 is in the first dielectric layer 204. A first etch stop layer 210 is over the pair of metal lines 206 and the first dielectric layer 204. A second dielectric layer 212 is above the etch stop layer 210. A metal line 214 is in the second dielectric layer 212. The metal line 214 is coupled to the pair of metal lines 206 by vias 208. A second etch stop layer 216 is over the metal line 214 and the second dielectric layer 212.

Figure 2B:
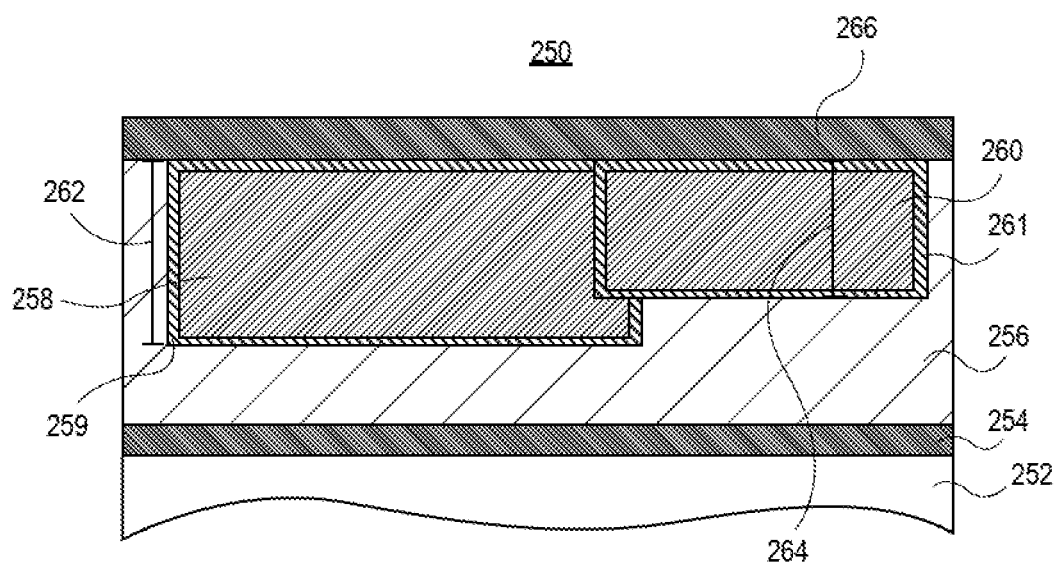
FIG. 2B illustrates a cross-sectional view of merged differentiated interconnect lines in a same dielectric layer, in accordance with an embodiment of the present disclosure.

In contrast to FIG. 2A, FIG. 2B illustrates a cross-sectional view of merged differentiated interconnect lines in a same dielectric layer, in accordance with an embodiment of the present disclosure.

Referring to FIG. 2B, an integrated circuit structure 250 includes a dielectric layer 256 above a first etch stop layer 254 above a substrate 252. A first metal line portion 258/259 is in the dielectric layer 256. The first metal line portion 258/259 can include a conductive fill 258 at least partially surrounded by a barrier layer 259. A second metal line portion 260/261 is the dielectric layer 256. The second metal line portion 260/261 can include a conductive fill 260 at least partially surrounded by a barrier layer 261. A second etch stop layer 266 is over the dielectric layer 256. In an embodiment, the first metal line portion 258/259 has a thickness 262 greater than the thickness 264 of the second metal line portion 260/261, as is depicted.

With reference again to FIG. 2B, in accordance with an embodiment of the present disclosure, an integrated circuit structure 250 includes an inter-layer dielectric (ILD) layer 256 above a substrate 252. A conductive interconnect line 258(259)/260(261) is in the ILD layer 256. The conductive interconnect line 258(259)/260(261) includes a first interconnect line portion 258(259) having a first height. A second interconnect line portion 260(261) is merged with the first interconnect line portion 258(259). The second interconnect line portion 260(261) has a second height less than the first height.

In one embodiment, the second interconnect line portion 260(261) has a top surface co-planar with a top surface of the first interconnect line portion 258(259), as is depicted. In one embodiment, the top surface of the first interconnect line portion 258(259) and the top surface of the second interconnect line portion 260(261) are co-planar with a top surface of the ILD layer 256. In one embodiment, the second interconnect line portion 260(261) has a width less than a width of the first interconnect line portion 258(259), as is depicted.

In one embodiment, the integrated circuit structure 250 further includes an etch stop layer 266 on the ILD layer 256. In one embodiment, the first interconnect line portion 258 (259) is defined by a first lithographic process, and the second interconnect line portion 260(261) is defined by a second lithographic process. In one embodiment, the first interconnect line portion 258(259) has a same composition as the second interconnect line portion 260(261). In one embodiment, the first interconnect line portion 258(259) has a different composition than the second interconnect line 260(261).

Figure 2C:
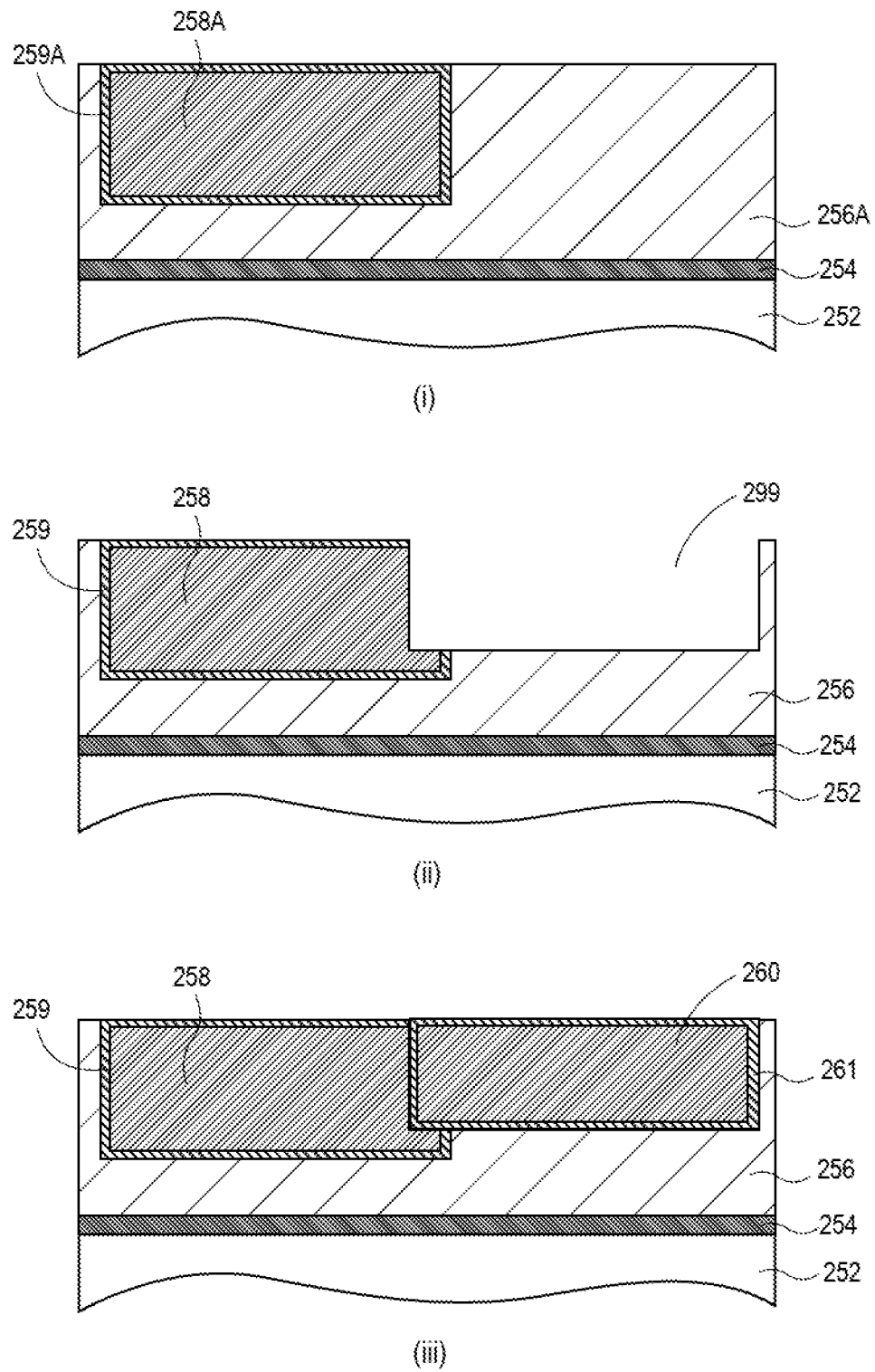
FIG. 2C illustrates cross-sectional views representing various operations in a method of fabricating merged differentiated interconnect lines in a same dielectric layer, in accordance with an embodiment of the present disclosure.

As an exemplary processing scheme, FIG. 2C illustrates cross-sectional views representing various operations in a method of fabricating merged differentiated interconnect lines in a same dielectric layer, in accordance with an embodiment of the present disclosure.

Referring to part (i) of FIG. 2C, a starting structure includes a dielectric layer 256A above an etch stop layer 254 above a substrate 252. A metal line 258A/259A is formed in the dielectric layer 256A. The metal line 258A/259A can include a conductive fill 258A at least partially surrounded by a barrier layer 259A. In one embodiment, the metal line 258A/259A is formed using a first lithographic process.

Referring to part (ii) of FIG. 2C, an opening 299 is etched into the structure of part (i) to provide patterned dielectric layer 256 and first metal line portion 258/259. In one embodiment, the opening 299 is formed using a second lithographic process different than the first lithographic process used to form metal line 258A/259A.

Referring to part (iii) of FIG. 2C, a second metal line portion 260/261 is formed in the opening 299. The second metal line portion 260/261 can include a conductive fill 260 at least partially surrounded by a barrier layer 261. It is to be appreciated that since they are fabricated in different operations, first metal line portion 258/259 can have a same or different composition as second metal line portion 260/261.

In another aspect, a short via for capacitor connection is described.

To provide context, for embedded memory applications with vertical capacitors, there needs to be a connection at a top and bottom of the electrode. Vertical metal insulator metal structures (MIM)s land on the top of an interconnect line that is patterned with a via that connects to the rest of the circuit. If the vertical MIM must connect to the top of a metal interconnect line, then the applications of such structure are limited. To enable intimate pairing with a transistor, a new type of connection is required.

Embodiments described herein may be implemented to provide a short capacitor via for landing a capacitor. The resulting structure may allow the capacitor to land directly on top of a backend (BE) transistor without adding an extra patterning layer. Embodiments can include a short via used to connect a vertical MIM directly to a circuit. The short via can connect to more interconnects or it can also connect directly to a transistor or resistor. It can contact transistors or contact in the front end or back end. The via can occupy the etch stop layer between two dielectric layers, but may also occupy a portion of either the above or below dielectric layer. Embodiments can be implemented to enable a large vertical capacitor to sit directly on top of a transistor, saving at least one layer of routing as compared to present approaches. Embodiments include a short capacitor via to enable connection to an interconnect layer below to reduce routing required to a connect vertical MIM to the circuit.

Figure 3A:
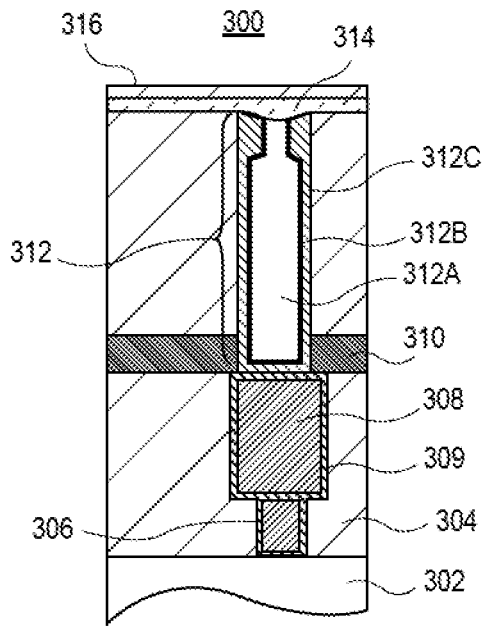
FIG. 3A illustrates a cross-sectional view of a capacitor connection based on a line and via.

To provide a comparative example, FIG. 3A illustrates a cross-sectional view of a capacitor connection based on a line and via.

Referring to FIG. 3A, an integrated circuit structure 300 includes a first dielectric layer 304 above a substrate 302. A metal line 308 and via 306 are in the first dielectric layer 304. A barrier layer 309 surrounds at least a portion of the metal line 308 and via 306. An etch stop layer 310 is over the first dielectric layer 304. A second dielectric layer is over the etch stop layer 310. A capacitor structure 312 is in the second dielectric layer and connects to metal line 308 through and opening in the etch stop layer 310. The capacitor structure 312 includes a metal fill plate 312A, a capacitor dielectric 312B, and a metal liner plate 312C. A conductive line 314 is coupled to the capacitor structure 312. A dielectric layer 316 is on the conductive line 314.

Figure 3B:
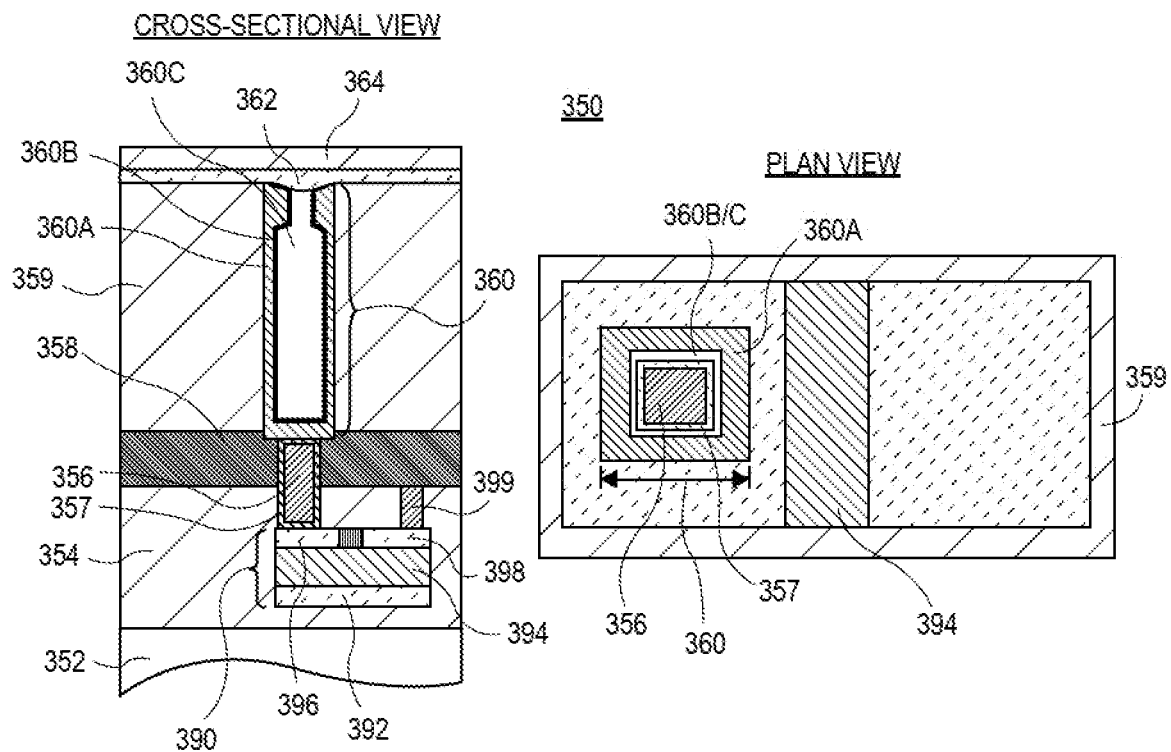
FIG. 3B illustrates a cross-sectional view and corresponding plan view of a capacitor connection based on a short via, in accordance with an embodiment of the present disclosure.

In contrast to FIG. 3A, FIG. 3B illustrates a cross-sectional view and corresponding plan view of a capacitor connection based on a short via, in accordance with an embodiment of the present disclosure.

Referring to FIG. 3B, an integrated circuit structure 350 includes a first dielectric layer 354 above a substrate 352. A short via 356 is in the first dielectric layer 354. A barrier layer 357 surrounds at least a portion of the short via 356. An etch stop layer 358 is over the first dielectric layer 354. A second dielectric layer 359 is over the etch stop layer 358. A capacitor structure 360 is in the second dielectric layer 359 and connects to short via 356 through and opening in the etch stop layer 358. The capacitor structure 360 includes a metal fill plate 360A, a capacitor dielectric 360B, and a metal liner plate 360C. A conductive line 362 is coupled to the capacitor structure 360. A dielectric layer 364 is on the conductive line 362.

Referring again to FIG. 3B, the short via 356 couples the capacitor structure 360 to a transistor 390. Transistor 390 can include a gate stack 392, a channel 394, a first source/drain region 396, a second source/drain region 398, and a source/drain contact 399. It is to be appreciated that the materials for gate stack 392, channel 394, first source/drain region 396, second source/drain region 398, and source/drain contact 399 may be as described below for like structures in association with FIG. 7.

In another aspect, an integrated circuit structure includes differentiated and merged differentiated metal lines. As an example, FIG. 4 illustrates a cross-sectional view of an integrated circuit structure including merged interconnect lines in a same dielectric layer, in accordance with an embodiment of the present disclosure.

Figure 4:
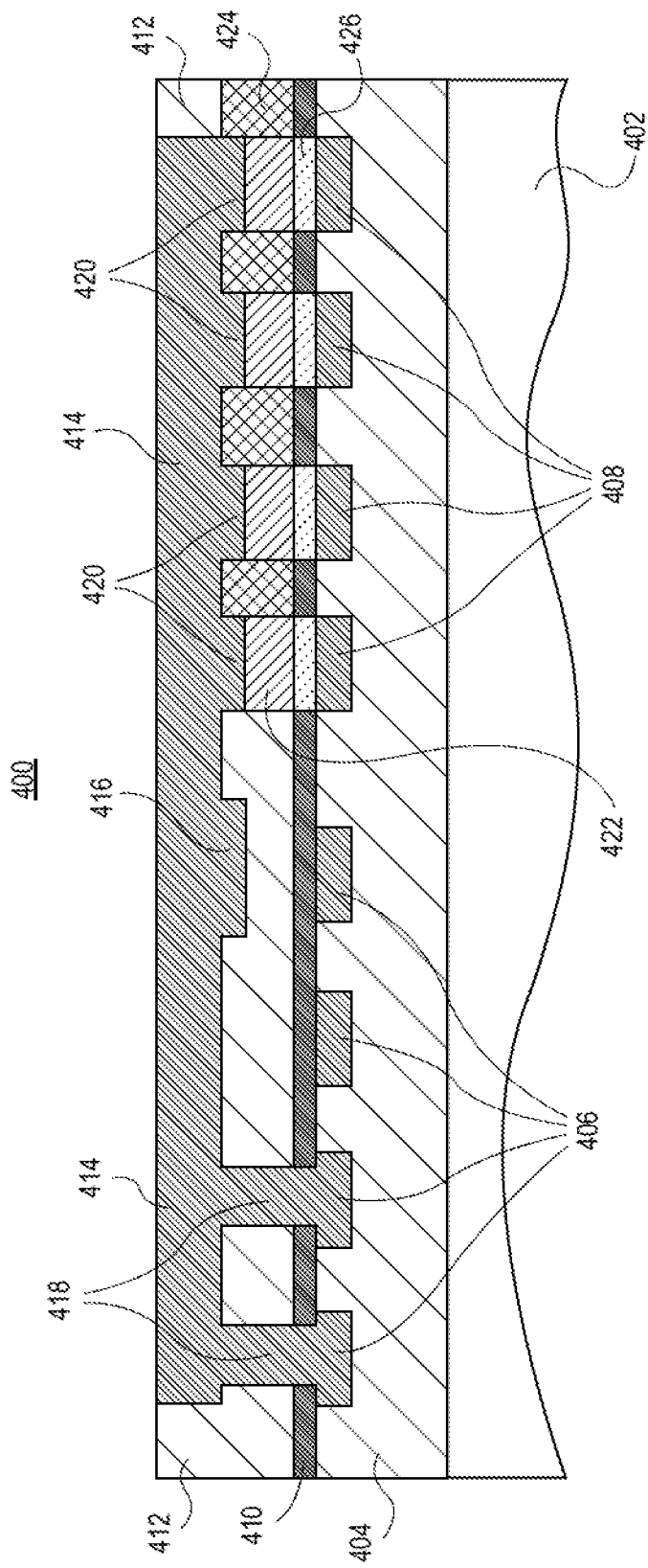
FIG. 4 illustrates a cross-sectional view of an integrated circuit structure including merged interconnect lines in a same dielectric layer, in accordance with an embodiment of the present disclosure.

Referring to FIG. 4, an integrated circuit structure includes a first dielectric layer 404 above a substrate 402. A plurality of first metal line types 406 and a plurality of second metal line types 408 are in the first dielectric layer 404. An etch stop layer 410 is on the first dielectric layer 404. A second dielectric layer 412 is on the etch stop layer 410. A merged differentiated conductive line 414 includes first and second line portions that meet at an overlap region 416. The merged differentiated conductive line 414 is coupled to one or more of the plurality of first metal line types 406 by conductive vias 418. The merged differentiated conductive line 414 is also coupled to source or drain regions 420 coupled to channel regions 422 coupled to source/drain structures 426 coupled to corresponding ones of the plurality of second metal line types 408. A distinct dielectric layer 424 may separate individual devices, as is depicted.

It is to be appreciated that the layers and materials described above in association with back end of line (BEOL) structures and processing may be formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structures depicted may be fabricated on underlying lower level interconnect layers.

Although the preceding methods of fabricating a metallization layer, or portions of a metallization layer, of a BEOL metallization layer are described in detail with respect to select operations, it is to be appreciated that additional or intermediate operations for fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed or both.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the art, and combinations thereof. The interlayer dielectric material may be formed by techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the art may be used depending upon the particular implementation. The hardmask layers maybe be formed by CVD, PVD, or by other deposition methods.

In an embodiment, as is also used throughout the present description, lithographic operations are performed using 193 nm immersion lithography (i193), extreme ultra-violet (EUV) lithography or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Figure 5A:
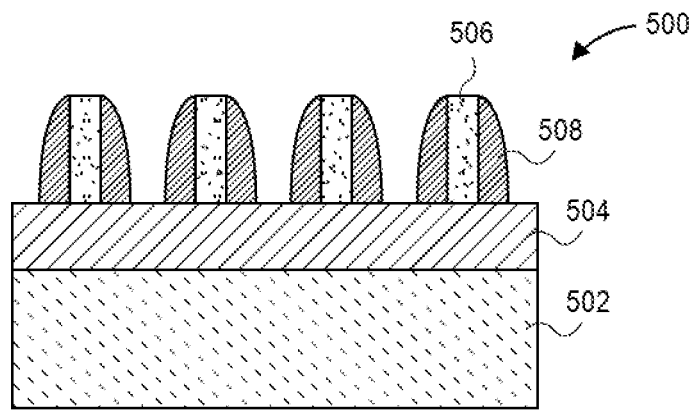
FIG. 5A illustrates a cross-sectional view of a starting structure following deposition, but prior to patterning, of a hardmask material layer formed on an interlayer dielectric (ILD) layer, in accordance with an embodiment of the present disclosure.
Figure 5B:
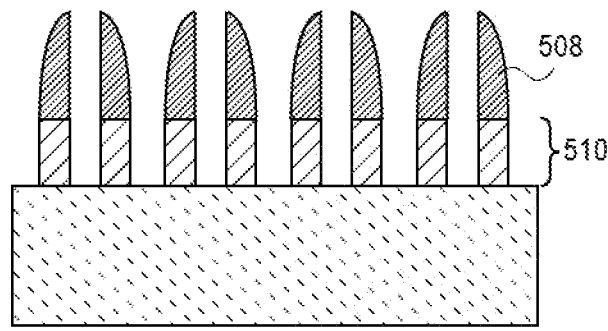
FIG. 5B illustrates a cross-sectional view of the structure of FIG. 5A following patterning of the hardmask layer by pitch halving, in accordance with an embodiment of the present disclosure.

In an embodiment, pitch division techniques are used to increase a line density. In a first example, pitch halving can be implemented to double the line density of a fabricated grating structure. FIG. 5A illustrates a cross-sectional view of a starting structure following deposition, but prior to patterning, of a hardmask material layer formed on an interlayer dielectric (ILD) layer. FIG. 5B illustrates a cross-sectional view of the structure of FIG. 5A following patterning of the hardmask layer by pitch halving.

Referring to FIG. 5A, a starting structure 500 has a hardmask material layer 504 formed on an interlayer dielectric (ILD) layer 502. A patterned mask 506 is disposed above the hardmask material layer 504. The patterned mask 506 has spacers 508 formed along sidewalls of features (lines) thereof, on the hardmask material layer 504.

Referring to FIG. 5B, the hardmask material layer 504 is patterned in a pitch halving approach. Specifically, the patterned mask 506 is first removed. The resulting pattern of the spacers 508 has double the density, or half the pitch or the features of the mask 506. The pattern of the spacers 508 is transferred, e.g., by an etch process, to the hardmask material layer 504 to form a patterned hardmask 510, as is depicted in FIG. 5B. In one such embodiment, the patterned hardmask 510 is formed with a grating pattern having unidirectional lines. The grating pattern of the patterned hardmask 510 may be a tight pitch grating structure. For example, the tight pitch may not be achievable directly through conventional lithography techniques. Even further, although not shown, the original pitch may be quartered by a second round of spacer mask patterning. Accordingly, the grating-like pattern of the patterned hardmask 510 of FIG. 5B may have hardmask lines spaced at a constant pitch and having a constant width relative to one another. The dimensions achieved may be far smaller than the critical dimension of the lithographic technique employed. Accordingly, a blanket film may be patterned using lithography and etch processing which may involve, e.g., spacer-based-double-patterning (SBDP) or pitch halving, or spacer-based-quadruple-patterning (SBQP) or pitch quartering.

Figure 6:
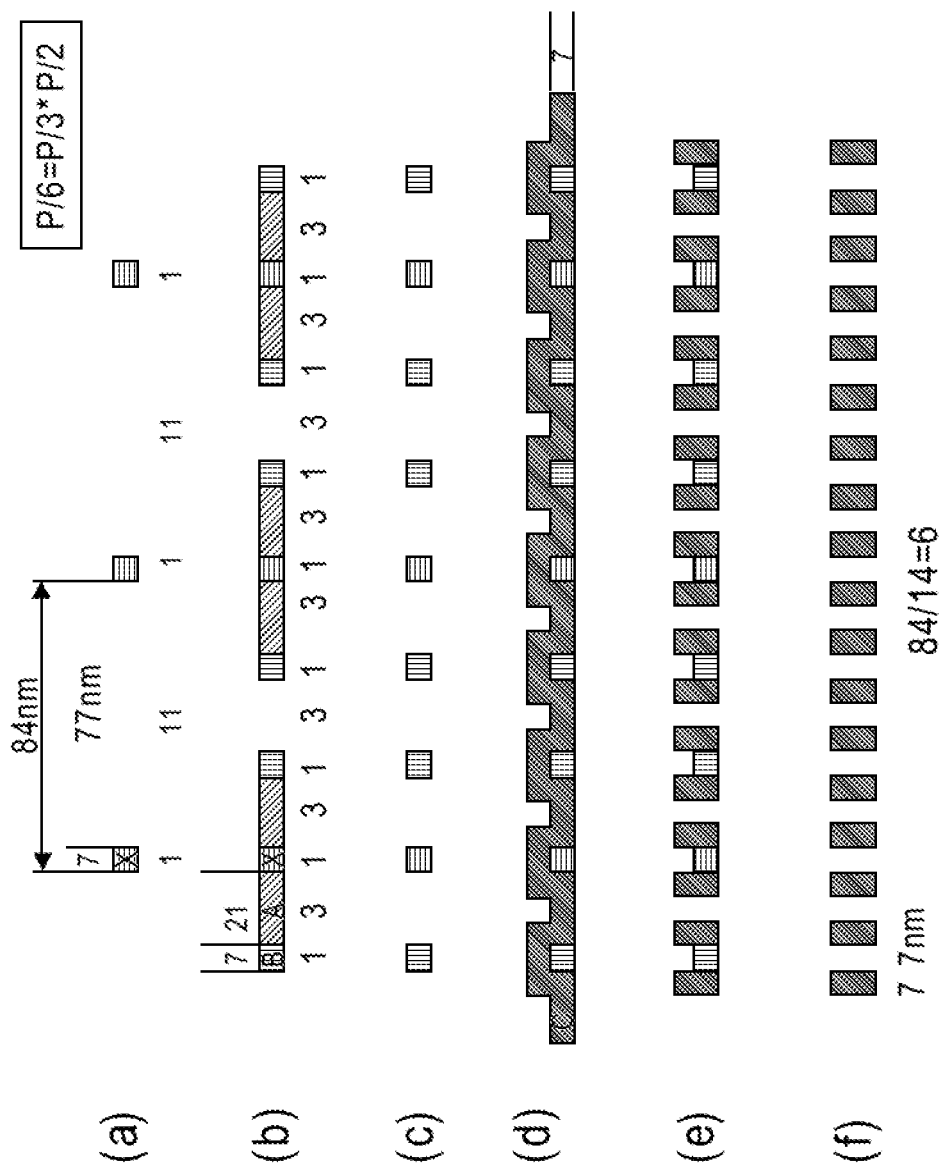
FIG. 6 illustrates cross-sectional views in a spacer-based-sextuple-patterning (SBSP) processing scheme which involves pitch division by a factor of six, in accordance with an embodiment of the present disclosure.

It is to be appreciated that other pitch division approaches may also be implemented. For example, FIG. 6 illustrates cross-sectional views in a spacer-based-sextuple-patterning (SBSP) processing scheme which involves pitch division by a factor of six. Referring to FIG. 6, at operation (a), a sacrificial pattern X is shown following litho, slim and etch processing. At operation (b), spacers A and B are shown following deposition and etching. At operation (c), the pattern of operation (b) is shown following spacer A removal. At operation (d), the pattern of operation (c) is shown following spacer C deposition. At operation (e), the pattern of operation (d) is shown following spacer C etch. At operation (f), a pitch/6 pattern is achieved following sacrificial pattern X removal and spacer B removal.

Figure 7A:
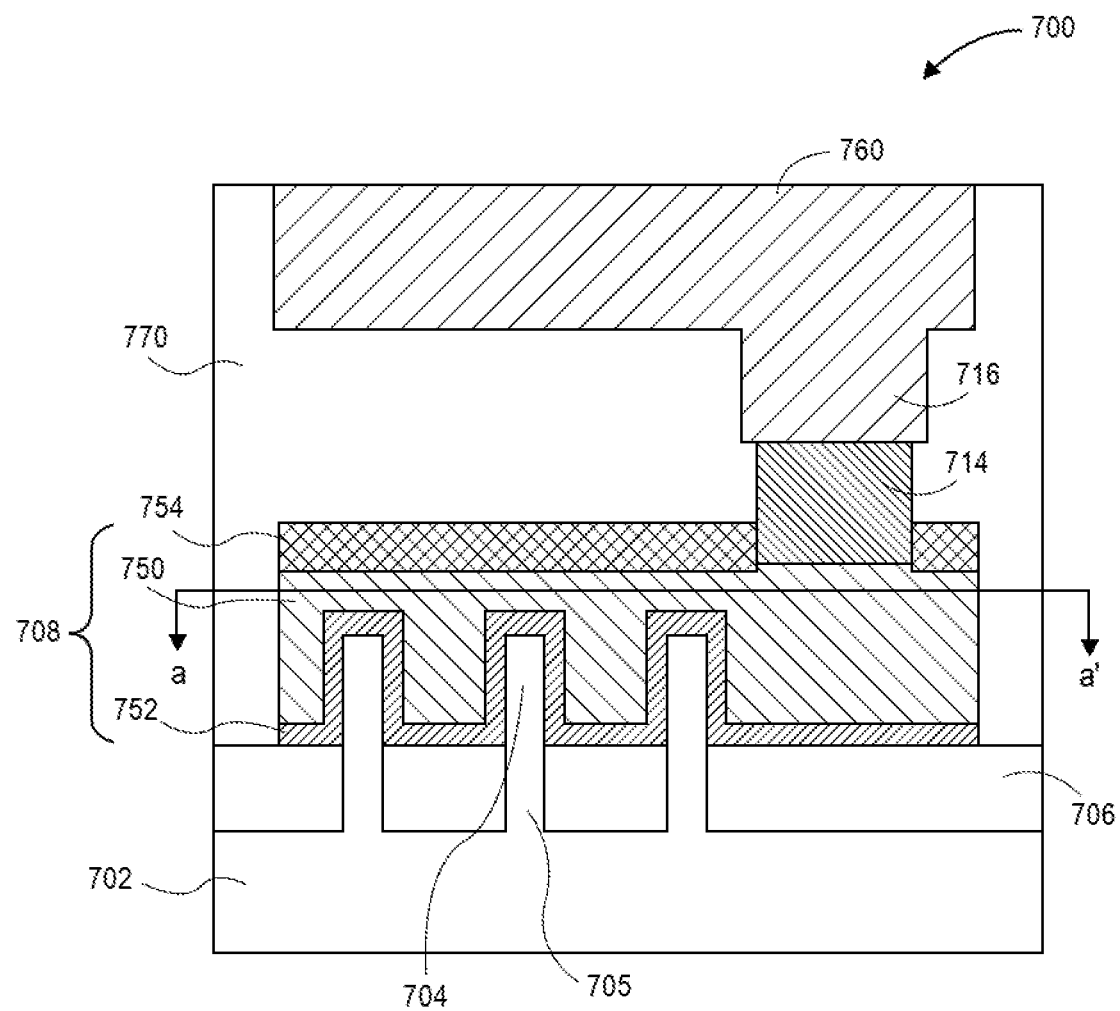
FIG. 7A illustrates a cross-sectional view of a non-planar semiconductor device that may be coupled to one interconnect line of a plurality of differentiated interconnect lines in a same dielectric layer, in accordance with an embodiment of the present disclosure, in accordance with an embodiment of the present disclosure.
Figure 7B:
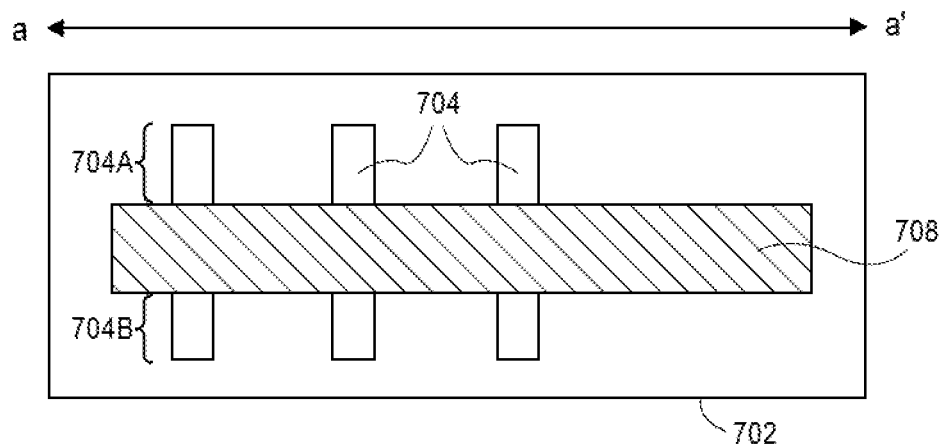
FIG. 7B illustrates a plan view taken along the a-a' axis of the semiconductor device of FIG. 7A, in accordance with an embodiment of the present disclosure.

In another aspect, one or more embodiments described herein are directed to fabricating semiconductor devices, such as for PMOS and NMOS device fabrication. As an example of a completed device as taken through a single gate line, FIG. 7A illustrates a cross-sectional view of a non-planar semiconductor device that may be coupled to one interconnect line of a plurality of differentiated interconnect lines in a same dielectric layer, in accordance with an embodiment of the present disclosure, in accordance with an embodiment of the present disclosure. FIG. 7B illustrates a plan view taken along the a-a' axis of the semiconductor device of FIG. 7A, in accordance with an embodiment of the present disclosure.

Referring to FIG. 7A, a semiconductor structure or device 700 includes a non-planar active region (e.g., a fin structure including protruding fin portion 704 and sub-fin region 705) formed from substrate 702, and within isolation region 706. A gate line 708 is disposed over the protruding portions 704 of the non-planar active region as well as over a portion of the isolation region 706. As shown, gate line 708 includes a gate electrode layer 750 and a gate dielectric layer 752. In one embodiment, gate line 708 may also include a dielectric cap layer 754. A gate contact 714, and overlying gate contact via 716 are also seen from this perspective, along with an overlying metal interconnect 760, all of which are disposed in inter-layer dielectric stacks or layers 770. The gate contact 714 is formed in an opening formed in the dielectric cap layer 754. Also seen from the perspective of FIG. 7A, the gate contact 714 is, in one embodiment, disposed over isolation region 706, but not over the non-planar active regions. In other embodiments, the gate contact 714 is disposed over the non-planar active regions. In accordance with an embodiment of the present disclosure, metal interconnect 760 is one of a plurality of differentiated interconnect lines in a same dielectric layer.

Referring to FIG. 7B, the gate line 708 is shown as disposed over the protruding fin portions 704. Source and drain regions 704A and 704B of the protruding fin portions 704 can be seen from this perspective. In one embodiment, the source and drain regions 704A and 704B are doped portions of original material of the protruding fin portions 704. In another embodiment, the material of the protruding fin portions 704 is removed and replaced with another semiconductor material, e.g., by epitaxial deposition. In either case, the source and drain regions 704A and 704B may extend below the height of dielectric layer 706, i.e., into the sub-fin region 705.

In an embodiment, the semiconductor structure or device 700 is a non-planar device such as, but not limited to, a fin-FET or a tri-gate device. In such an embodiment, a corresponding semiconducting channel region is composed of or is formed in a three-dimensional body. In one such embodiment, the gate electrode stacks of gate lines 708 surround at least a top surface and a pair of sidewalls of the three-dimensional body.

Substrate 702 may be composed of a semiconductor material that can withstand a manufacturing process and in which charge can migrate. In an embodiment, substrate 702 is a bulk substrate composed of a crystalline silicon, silicon/germanium or germanium layer doped with a charge carrier, such as but not limited to phosphorus, arsenic, boron or a combination thereof, to form active region 704. In one embodiment, the concentration of silicon atoms in bulk substrate 702 is greater than 97%. In another embodiment, bulk substrate 702 is composed of an epitaxial layer grown atop a distinct crystalline substrate, e.g. a silicon epitaxial layer grown atop a boron-doped bulk silicon mono-crystalline substrate. Bulk substrate 702 may alternatively be composed of a group III-V material. In an embodiment, bulk substrate 702 is composed of a group III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 702 is composed of a group III-V material and the charge-carrier dopant impurity atoms are ones such as, but not limited to, carbon, silicon, germanium, oxygen, sulfur, selenium or tellurium.

Isolation region 706 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 706 is composed of a dielectric material such as, but not limited to, silicon dioxide, silicon oxy-nitride, silicon nitride, or carbon-doped silicon nitride.

Gate line 708 may be composed of a gate electrode stack which includes a gate dielectric layer 752 and a gate electrode layer 750. In an embodiment, the gate electrode layer 750 of the gate electrode stack is composed of a metal gate and the gate dielectric layer 752 is composed of a high-k material. For example, in one embodiment, the gate dielectric layer 752 is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 702. In an embodiment, the gate dielectric layer is composed of a top high-k portion and a lower portion composed of an oxide of a semiconductor material. In one embodiment, the gate dielectric layer 752 is composed of a top portion of hafnium oxide and a bottom portion of silicon dioxide or silicon oxy-nitride.

In an embodiment, the gate electrode layer 750 of gate line 708 is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer 750 may consist of a P-type workfunction metal or an N-type workfunction metal, depending on whether the transistor is to be a PMOS or an NMOS transistor. In some implementations, the gate electrode layer 750 may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 714 and overlying gate contact via 716 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material). In accordance with another embodiment of the present disclosure, the gate contact 714 is a self-aligned gate contact.

In an embodiment (although not shown), providing structure 700 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate stack structure 708 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 700. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 7A, the arrangement of semiconductor structure or device 700 places the gate contact over isolation regions. Such an arrangement may be viewed as inefficient use of layout space. In another embodiment, however, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) or smaller technology node.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the art. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
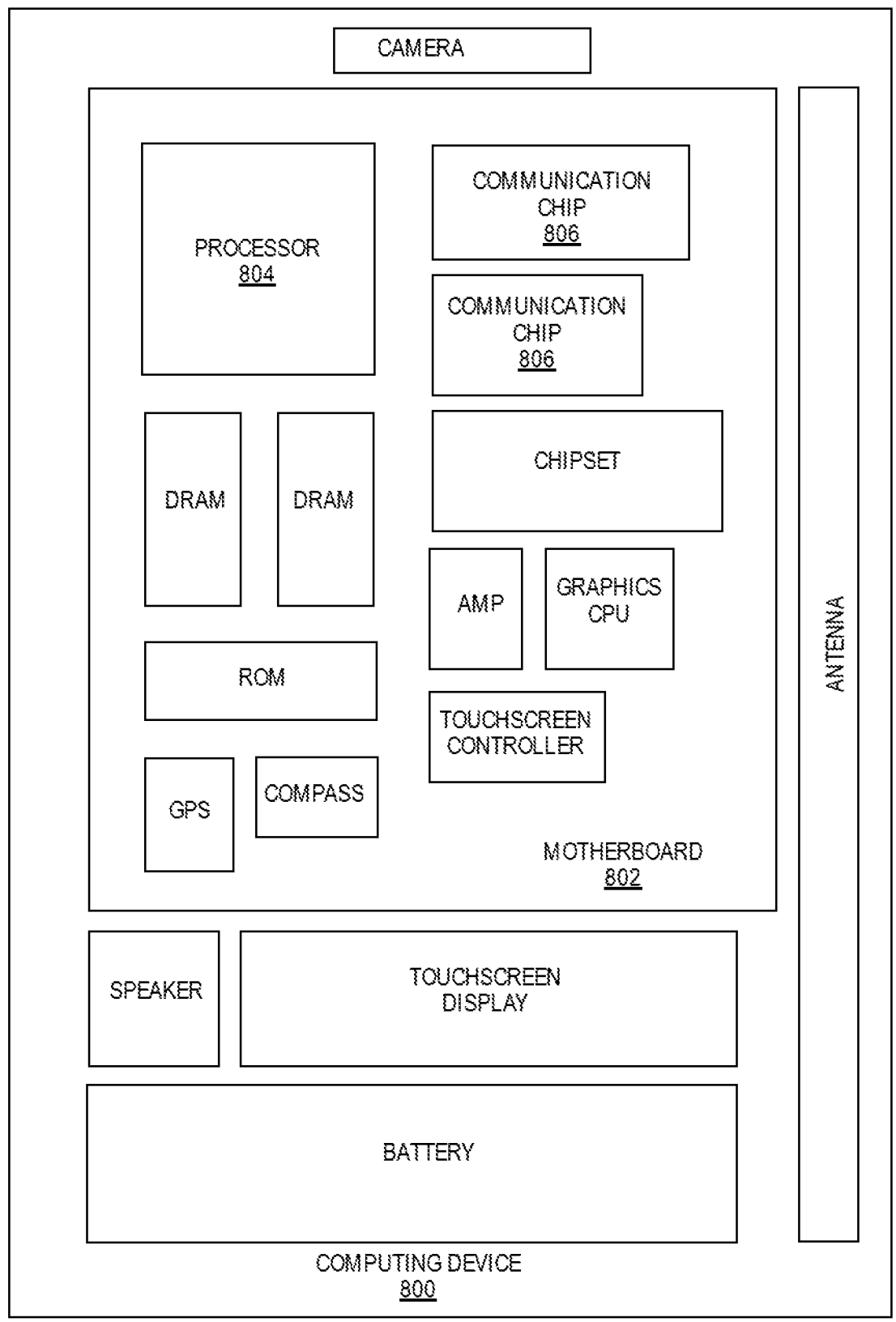
FIG. 8 illustrates a computing device in accordance with one implementation of an embodiment of the present disclosure.

FIG. 8 illustrates a computing device 800 in accordance with one implementation of the disclosure. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the disclosure, the integrated circuit die of the processor includes an integrated circuit structure having differentiated interconnect lines in a same dielectric layer, built in accordance with implementations of embodiments of the disclosure. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the disclosure, the integrated circuit die of the communication chip includes an integrated circuit structure having differentiated interconnect lines in a same dielectric layer, built in accordance with implementations of embodiments of the disclosure.

In further implementations, another component housed within the computing device 800 may contain an integrated circuit die that includes an integrated circuit structure having differentiated interconnect lines in a same dielectric layer, built in accordance with implementations of embodiments of the disclosure.

In various implementations, the computing device 800 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
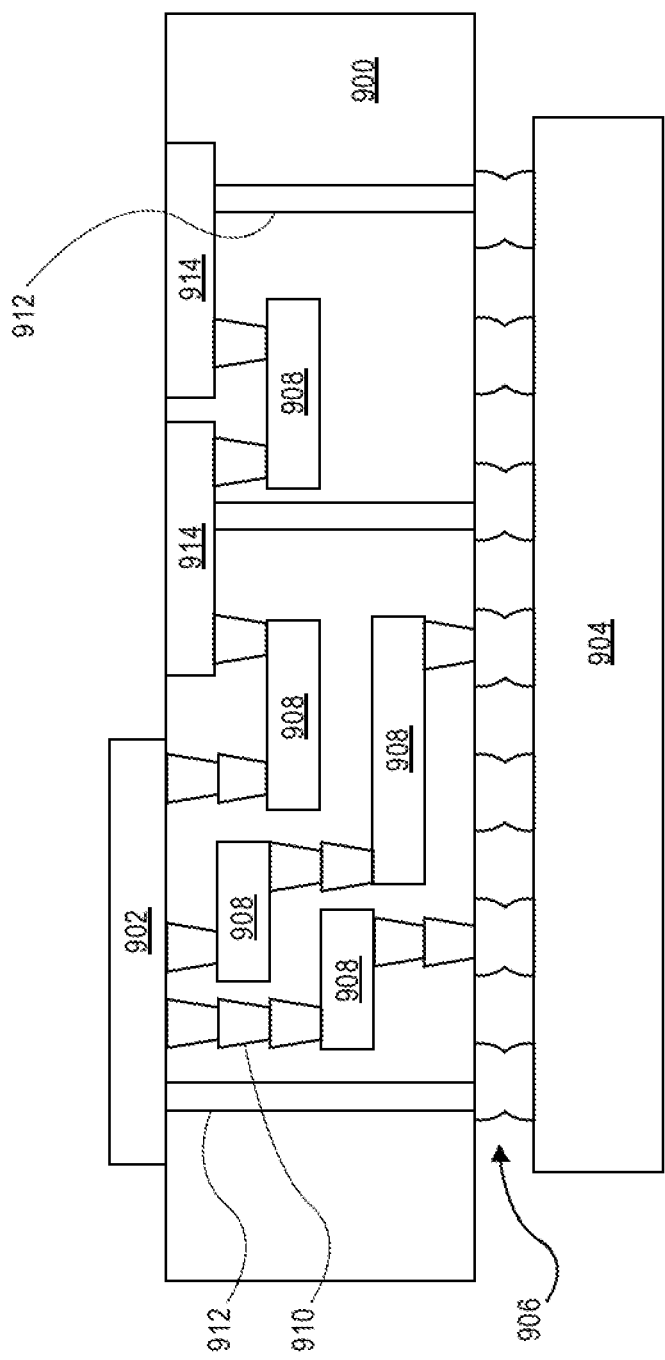
FIG. 9 is an interposer implementing one or more embodiments of the disclosure.

FIG. 9 illustrates an interposer 900 that includes one or more embodiments of the disclosure. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900. In accordance with embodiments of the disclosure, apparatuses or processes disclosed herein may be used in the fabrication of interposer 900 and/or in the fabrication of substrates connected thereto.

Thus, embodiments of the present disclosure include integrated circuit structures having differentiated interconnect lines in a same dielectric layer, and methods of fabricating integrated circuit structures having differentiated interconnect lines in a same dielectric layer.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes an inter-layer dielectric (ILD) layer above a substrate. A plurality of conductive interconnect lines is in the ILD layer. The plurality of conductive interconnect lines includes a first interconnect line having a first height, and a second interconnect line immediately laterally adjacent to but spaced apart from the first interconnect line, the second interconnect line having a second height less than the first height.

Example embodiment 2: The integrated circuit structure of example embodiment 1, wherein the second interconnect line has a top surface below a top surface of the first interconnect line.

Example embodiment 3: The integrated circuit structure of example embodiment 2, wherein the top surface of the first interconnect line is co-planar with a top surface of the ILD layer.

Example embodiment 4: The integrated circuit structure of example embodiment 1, 2 or 3, wherein the second interconnect line has a bottom surface above a bottom surface of the first interconnect line.

Example embodiment 5: The integrated circuit structure of example embodiment 1 or 4, wherein the second interconnect line has a top surface co-planar with a top surface of the first interconnect line.

Example embodiment 6: The integrated circuit structure of example embodiment 1, 2, 3, 4 or 5, wherein the second interconnect line has a width less than a width of the first interconnect line.

Example embodiment 7: The integrated circuit structure of example embodiment 1, 2, 3, 4, 5 or 6, wherein the integrated circuit structure further includes an etch stop layer on the ILD layer.

Example embodiment 8: The integrated circuit structure of example embodiment 1, 2, 3, 4, 5, 6 or 7, wherein the first interconnect line is defined by a first lithographic process, and the second interconnect line is defined by a second lithographic process.

Example embodiment 9: The integrated circuit structure of example embodiment 1, 2, 3, 4, 5, 6, 7 or 8, wherein the first interconnect line has a same composition as the second interconnect line.

Example embodiment 10: The integrated circuit structure of example embodiment 1, 2, 3, 4, 5, 6, 7 or 8, wherein the first interconnect line has a different composition than the second interconnect line.

Example embodiment 11: An integrated circuit structure includes an inter-layer dielectric (ILD) layer above a substrate. A conductive interconnect line is in the ILD layer. The conductive interconnect line includes a first interconnect line portion having a first height. A second interconnect line portion is merged with the first interconnect line portion, the second interconnect line portion having a second height less than the first height.

Example embodiment 12: The integrated circuit structure of example embodiment 11, wherein the second interconnect line portion has a top surface co-planar with a top surface of the first interconnect line portion.

Example embodiment 13: The integrated circuit structure of example embodiment 12, wherein the top surface of the first interconnect line portion and the top surface of the second interconnect line portion are co-planar with a top surface of the ILD layer.

Example embodiment 14: The integrated circuit structure of example embodiment 11, 12 or 13, wherein the second interconnect line portion has a width less than a width of the first interconnect line portion.

Example embodiment 15: The integrated circuit structure of example embodiment 11, 12, 13 or 14, further including an etch stop layer on the ILD layer.

Example embodiment 16: The integrated circuit structure of example embodiment 11, 12, 13, 14 or 15, wherein the first interconnect line portion is defined by a first lithographic process, and the second interconnect line portion is defined by a second lithographic process.

Example embodiment 17: The integrated circuit structure of example embodiment 11, 12, 13, 14, 15 or 16, wherein the first interconnect line portion has a same composition as the second interconnect line portion.

Example embodiment 18: The integrated circuit structure of example embodiment 11, 12, 13, 14, 15 or 16, wherein the first interconnect line portion has a different composition than the second interconnect line portion.

Example embodiment 19: A computing device includes a board, and a component coupled to the board. The component includes an integrated circuit structure. The integrated circuit structure includes an inter-layer dielectric (ILD) layer above a substrate. A plurality of conductive interconnect lines is in the ILD layer. The plurality of conductive interconnect lines includes a first interconnect line having a first height, and a second interconnect line immediately laterally adjacent to but spaced apart from the first interconnect line, the second interconnect line having a second height less than the first height.

Example embodiment 20: The computing device of example embodiment 19, further including a memory coupled to the board.

Example embodiment 21: The computing device of example embodiment 19 or 20, further including a camera coupled to the board.

Example embodiment 22: The computing device of example embodiment 19, 20 or 21, further including a battery coupled to the board.

Example embodiment 23: The computing device of example embodiment 19, 20, 21 or 22, wherein the component is a packaged integrated circuit die.

Example embodiment 24: The computing device of example embodiment 19, 20, 21, 22 or 23, wherein the component is selected from the group consisting of a processor, a communications chip, and a digital signal processor.

Example embodiment 25: The computing device of example embodiment 19, 20, 21, 22, 23 or 24, wherein the computing device is selected from the group consisting of a mobile phone, a laptop, a desk top computer, a server, and a set-top box.

What is claimed is:

1. An integrated circuit structure, comprising:
   an inter-layer dielectric (ILD) layer above a substrate; and
   a plurality of conductive interconnect lines in the ILD layer, the plurality of conductive interconnect lines comprising:
   a first conductive interconnect line; and
   a second conductive interconnect line immediately adjacent to the first conductive interconnect line, the second conductive interconnect line having a bottommost surface above a bottommost surface of the first conductive interconnect line, and the second conductive interconnect line having an uppermost surface below an uppermost surface of the first conductive interconnect line, wherein the ILD layer is on the uppermost surface of the second conductive interconnect line,
   wherein the second conductive interconnect line has a width less than a width of the first conductive interconnect line.

2. The integrated circuit structure of claim 1, wherein the uppermost surface of the first conductive interconnect line is co-planar with a top surface of the ILD layer.

3. The integrated circuit structure of claim 1, further comprising:
   an etch stop layer on the ILD layer.

4. The integrated circuit structure of claim 1, wherein the first conductive interconnect line is defined by a first lithographic process, and the second conductive interconnect line is defined by a second lithographic process.

5. The integrated circuit structure of claim 1, wherein the first conductive interconnect line has a same composition as the second conductive interconnect line.

6. The integrated circuit structure of claim 1, wherein the first conductive interconnect line has a different composition than the second conductive interconnect line.

7. A computing device, comprising:
   a board; and
   a component coupled to the board, the component including an integrated circuit structure, comprising:
   an inter-layer dielectric (ILD) layer above a substrate; and
   a plurality of conductive interconnect lines in the ILD layer, the plurality of conductive interconnect lines comprising:
   a first conductive interconnect line; and
   a second conductive interconnect line immediately adjacent to the first conductive interconnect line, the second conductive interconnect line having a bottommost surface above a bottommost surface of the first conductive interconnect line, and the second conductive interconnect line having an uppermost surface below an uppermost surface of the first conductive interconnect line, wherein the ILD layer is on the uppermost surface of the second interconnect line, wherein the second conductive interconnect line has a width less than a width of the first conductive interconnect line.

8. The computing device of claim 7, further comprising: a memory coupled to the board.

9. The computing device of claim 7, further comprising: a camera coupled to the board.

10. The computing device of claim 7, further comprising: a battery coupled to the board.

11. The computing device of claim 7, wherein the component is a packaged integrated circuit die.

12. The computing device of claim 7, wherein the component is selected from the group consisting of a processor, a communications chip, and a digital signal processor.

13. The computing device of claim 7, wherein the computing device is selected from the group consisting of a mobile phone, a laptop, a desk top computer, a server, and a set-top box.

* * * * *